(12) United States Patent
Masuda et al.

(10) Patent No.: US 7,894,279 B2
(45) Date of Patent: Feb. 22, 2011

(54) SEMICONDUCTOR STORAGE DEVICE COMPRISING REFERENCE CELL DISCHARGE OPERATION LOAD REDUCTION

(75) Inventors: Takafumi Masuda, Kanagawa (JP);
Kenichi Serizawa, Kanagawa (JP);
Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 188 days.

(21) Appl. No.: 12/252,548

(22) Filed: Oct. 16, 2008

(65) Prior Publication Data
US 2009/0129175 A1    May 21, 2009

(30) Foreign Application Priority Data
Nov. 16, 2007    (JP) .............................. 2007-297614

(51) Int. Cl.
*G11C 5/14* (2006.01)
(52) U.S. Cl. ............... 365/189.09; 365/203; 365/210.1; 365/149; 365/150; 365/186; 365/189.11; 365/204; 365/205; 365/207; 365/210.12
(58) Field of Classification Search ............ 365/189.09, 365/203, 210.1, 149, 150, 186, 189.11, 204, 365/205, 207, 210.12
See application file for complete search history.

(56) References Cited

U.S. PATENT DOCUMENTS 6,914,840 B2 * 7/2005 Agata ..................... 365/210.15
7,535,782 B2 * 5/2009 Vernet et al. ................. 365/205

FOREIGN PATENT DOCUMENTS

JP          2004-265533        9/2004

* cited by examiner

*Primary Examiner*—Hoai V Ho
*Assistant Examiner*—Fernando N Hidalgo
(74) *Attorney, Agent, or Firm*—Young & Thompson (57) ABSTRACT

A semiconductor storage device precharging a bit line pair to a ground potential includes a sense amplifier connected between the bit line pair, a storage cell connected to one of the bit line pair and storing data, a first transistor controlling a conduction state between the other of the bit line pair and a reference cell node, a second transistor connected between a reference voltage source generating a reference voltage and the reference cell node, the second transistor exclusively controlled from the first transistor, and a capacitor setting a potential of the reference cell node.

8 Claims, 6 Drawing Sheets

SEMICONDUCTOR STORAGE DEVICE COMPRISING REFERENCE CELL DISCHARGE OPERATION LOAD REDUCTION

BACKGROUND OF THE INVENTION

1. Field of the Invention

The present invention relates to a semiconductor storage device, and more specifically, to a DRAM (Dynamic Random Access Memory)

2. Description of Related Art

A DRAM cell storing data with a capacitative element has been known as a semiconductor storage device. In the DRAM, the data is read out or written after executing a precharge operation, which is an operation of setting bit lines to a predetermined level. A half VDD precharge method has been typically executed in which the bit lines are set to the level around the midpoint potential between a power supply potential VDD and a ground potential GND as the precharge level. However, as the power supply voltage VDD decreases, the level set in the precharge operation has also been decreasing. Therefore, according to the related half VDD precharge method, the precharge level and a threshold value of a sense amplifier are quite close to each other, which makes it impossible to execute the sense operation with accuracy. In order to overcome this problem, a technique of applying the ground potential (GND) level to the precharge level has been employed in recent years. A technique of precharging the level of the bit lines to GND is disclosed in Japanese Unexamined Patent Application Publication No. 2004-265533.

Figure 7:
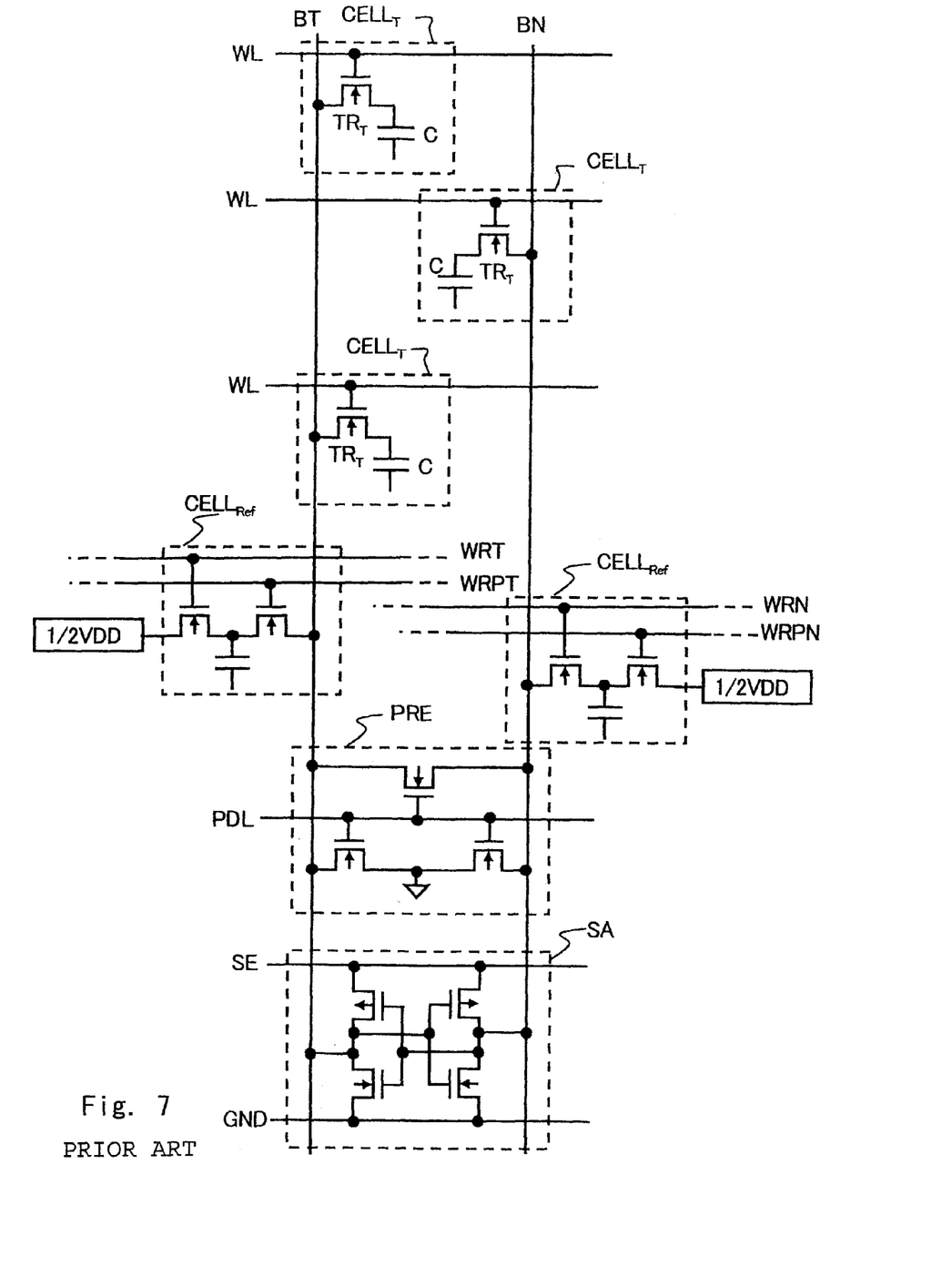
FIG. 7 is a circuit diagram showing a semiconductor storage circuit according to a related art.

FIG. 7 shows a circuit structure with one bit line pair of a DRAM cell executing a GND precharqe according to a related art. In the circuit shown in FIG. 7, memory cells $CELL_T$ (hereinafter referred to as main cell) holding actual data and reference cells (hereinafter referred to as Ref cell) $CELL_{Ref}$ outputting reference voltage are connected to each of bit line pair BT and BN. A precharge circuit PRE and a sense amplifier SA are also connected between the bit line pair.

Now, an operation of reading out the main cell connected to the bit line BT of the related circuit will be described. Before starting the reading operation, the bit line pair BT and BN is precharged to a ground potential. When word lines WL and WRN are raised, the memory cell $CELL_T$ and the Ref cell $CELL_{Ref}$ release the charge held therein to the bit lines BT and BN. At this time, the Ref cell $CELL_{Ref}$ outputs substantially half the voltage of the voltage corresponding to "H" level output from the main cell $CELL_T$. Accordingly, even when "L" level is held in the main cell $CELL_T$, the sense amplifier SA can execute the normal sense operation.

Then the sense amplifier SA is operated by a sense amplifier activating signal SE. The sense amplifier SA amplifies a voltage difference of the bit line pair, and a normal operation such as reading is performed. Upon completion of the operation such as the reading, the bit line pair is again precharged to GND. This operation is executed by the precharge circuit RRE which is activated by the rise of the precharge signal PDL. A word line WRPN is raised in the precharge operation. A transistor $TR_{VRef}$ formed in the Ref cell connects the Ref cell $CELL_{Ref}$ to a reference voltage source which is the different from the power supply for the bit line and outputs substantially half the voltage (1/2 VDD) of the power supply voltage.

Due to this operation, when the Ref cell holds the charge outputting the "H" level, and the bit line BN is in the "H" level in the reading operation by the operation of the sense amplifier SA, substantially half the charge is discharged from the Ref cell. Substantially half the voltage of the voltage corresponding to the "H" level from the main cell in the reading operation is output by the operation of connecting the Ref cell to 1/2 VDD in the precharge operation.

According to the above operation, the Ref cell needs to be charged or discharged to 1/2 VDD by the reference voltage source outputting 1/2 VDD while precharging the bit lines to GND. Although only one main cell and one Ref cell are connected to one word line in FIG. 7, several hundreds or several thousands of main cells and Ref cells are actually connected to one word line. Therefore, if there is a need to charge all the Ref cells connected to one word line by the reference voltage source outputting 1/2VDD, the ability of the reference voltage source as the power supply circuit needs to be made sufficiently high in order to charge all the Ref cells to 1/2 VDD within the precharge period On the contrary, if all the Ref cells are to be discharged, it may be sometimes impossible to perform discharge for the sufficient amount in the precharge period, and the voltage of the Ref cell may not be decreased to 1/2 VDD.

When the ability of the power supply circuit of the reference voltage source is made high, the power supply circuit itself can be larger. Even when the voltage of the Ref cell is stabilized by an element such as a stabilizing capacitor, the circuit size can be larger due to the increase of the number of elements.

SUMMARY

In one embodiment, there is provided a semiconductor storage device precharging a bit line pair to a ground potential, the semiconductor storage device including a sense amplifier connected between the bit line pair, a storage cell connected to one of the bit line pair and storing data, a first transistor controlling a conduction state between the other of the bit line pair and a reference cell node, a second transistor connected between a reference voltage source generating a reference voltage and the reference cell node, the second transistor being exclusively controlled from the first transistor, and a capacitor setting a potential of the reference cell node, in which the semiconductor storage device aids charge and discharge of the capacitor when the second transistor is in the conduction state by using a negative-phase current of a current flowing between the reference cell node and the second transistor.

According to the present invention, it is possible to reduce the load applied to the reference voltage source.

According to the present invention, it is possible to reduce the load applied to the reference voltage source regarding the current flowing in the reference cell node of the Ref cell in the discharge operation, which makes it possible to prevent the circuit size from being increased.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
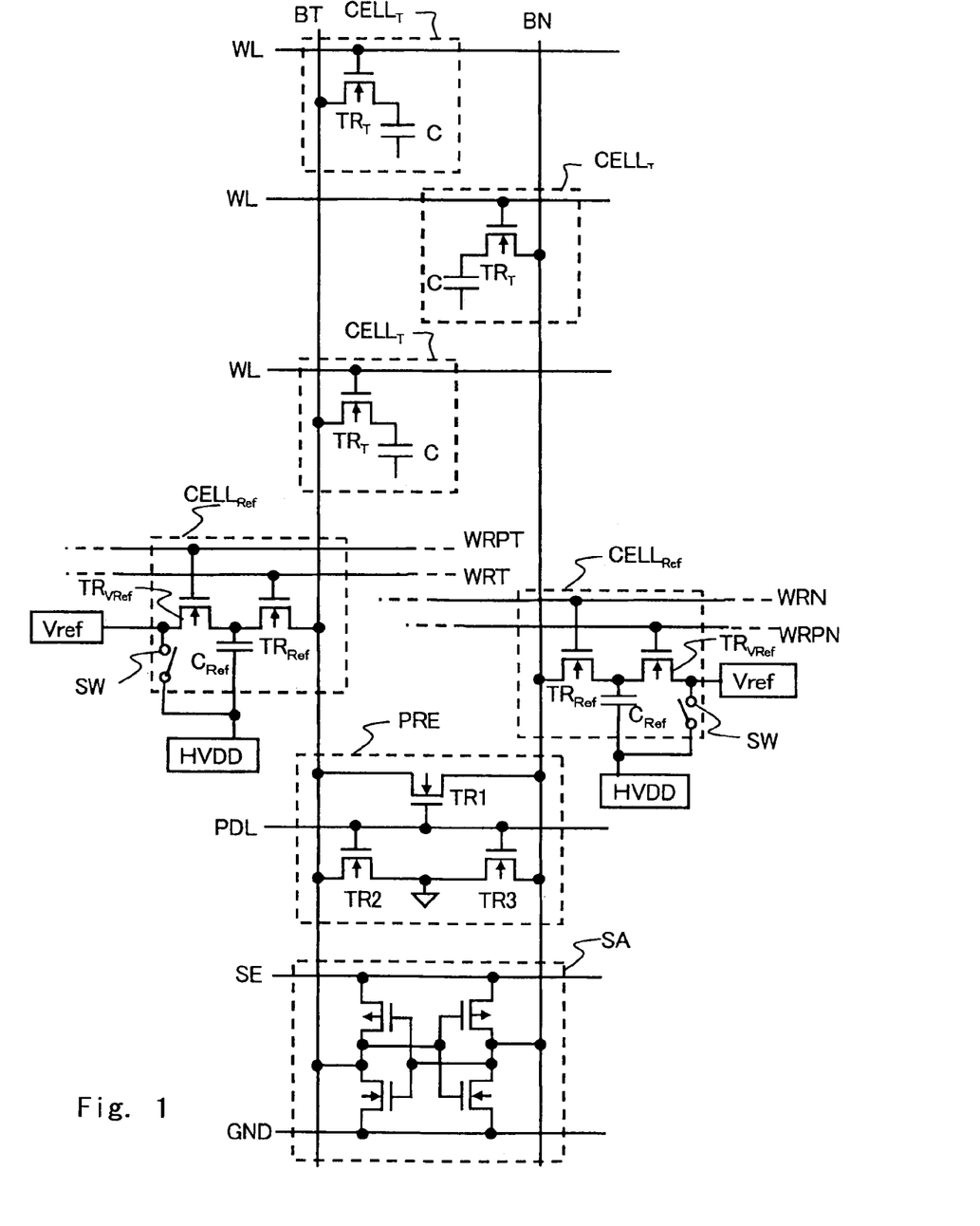
FIG. 1 is a circuit diagram showing a semiconductor storage circuit according to a first embodiment.

The first embodiment of the present invention will be described with reference to the drawings. FIG. 1 shows a circuit with one bit line pair of a DRAM according to the present embodiment. As shown in FIG. 1, the DRAM according to the present embodiment includes bit lines BT and BN, memory cells (hereinafter referred to as main cell) $CELL_T$ storing data, reference cells (hereinafter referred to as Ref cell) $CELL_{Ref}$, a first transistor (hereinafter referred to as Ref cell connecting transistor) $TR_{Ref}$ connecting the Ref cell and the bit line, a second transistor (hereinafter referred to as Ref voltage supply transistor) $TR_{VRef}$ connecting the Ref cell and the reference voltage source Vref, a precharge circuit PRE, a sense amplifier SA, reference voltage generating circuits Vref, and bias voltage generating circuits HVDD generating half the voltage of a power supply voltage.

The main cell $CELL_T$ comprises an NMOS transistor $TR_T$ and a capacitor C. A gate of the transistor $TR_T$ of the main cell $CELL_T$ is connected to the word line WL, one of a source or a drain thereof is connected to the bit line BT, and the other of the source or the drain thereof is connected to the capacitor C. The other end of the capacitor which is not connected to the transistor receives substantially half the voltage of the power supply voltage generated by the bias voltage generating circuit HVDD. A main cell having the similar configuration as the main cell connected to the bit line BT is also connected to the bit line BN side. The word line WL corresponding to the main cell being supposed to execute the reading or writing is raised so that the reading or writing is performed on the main cell. The main cell $CELL_T$ stores a logical value corresponding to "H" or "L" by holding charge in the capacitor C. Accordingly, the hit line BT (or BN) becomes a voltage corresponding to "H" level (first voltage) or a voltage corresponding to "L" level (second voltage) in reading based on the charge held in the capacitor.

The Ref cell $CELL_{Ref}$ comprises above-described Ref cell connecting transistor $TR_{Ref}$, the Ref voltage supply transistor $TR_{VRef}$, and a reference capacitor (hereinafter referred to as Ref capacitor) $C_{Ref}$ for holding the reference voltage.

The Ref cell connecting transistor $TR_{Ref}$ connected to the bit line BN side is a switch formed by an NMOS transistor. A gate of the $TR_{Ref}$ is connected to a word line WRN, a source is connected to the bit line BN, and a drain is connected to one end (reference cell node) of the capacitor $C_{Ref}$ forming the Ref cell. The Ref voltage supply transistor $TR_{VRef}$ includes a gate connected to a word line WRPN, one of a source or a drain connected to the reference voltage source Vref, and the other of the source or the drain connected to one end of the capacitor $C_{Ref}$. The other end of the Ref capacitor $C_{Ref}$ which is not connected to the transistor is connected to the bias voltage generating circuit HVDD (bias node).

Further, the bias voltage generating circuit HVDD and one end of the Ref voltage supply transistor $TR_{VRef}$ are connected to each other through a switch SW. The $CELL_{Ref}$ is also connected to the bit line BT side, and word lines WRT and WRPT drive a third transistor (Ref cell connecting transistor $TR_{Ref}$) and a fourth transistor (Ref voltage supply transistor $TR_{VRef}$). When the data in the main cell connected to the bit line BN side is read out or the data is written into the main cell, the $CELL_{Ref}$ which is connected to the bit line BT side is employed. Note that the reference voltage Vref is substantially half the voltage of the power supply voltage VDD.

The precharge circuit PRE comprises three transistors TR1, TR2, and TR3. The transistor TR1 is connected to the bit lines BT and BN. The transistor TR2 is connected to the bit line BT and a ground potential (GND level), and the transistor TR3 is connected to the bit line BN and the ground potential. Gates of the TR1 to TR3 are connected to the precharge line PDL. The precharge line PDL becomes the "H" level so that the TR1 to TR3 are in the ON state, and the bit lines BT and BN are precharged to the GND level.

The sense amplifier SA is connected between the bit lines BT and BN. The sense amplifier SA is formed by a known sense amplifier having a configuration in which two inverters are connected. The sense amplifier SA amplifies the potential difference between the bit lines BT and BN when the sense enable signal SE is in the "H" level. The logical value held by the main cell is determined based on the output of the sense amplifier SA.

Figure 2:
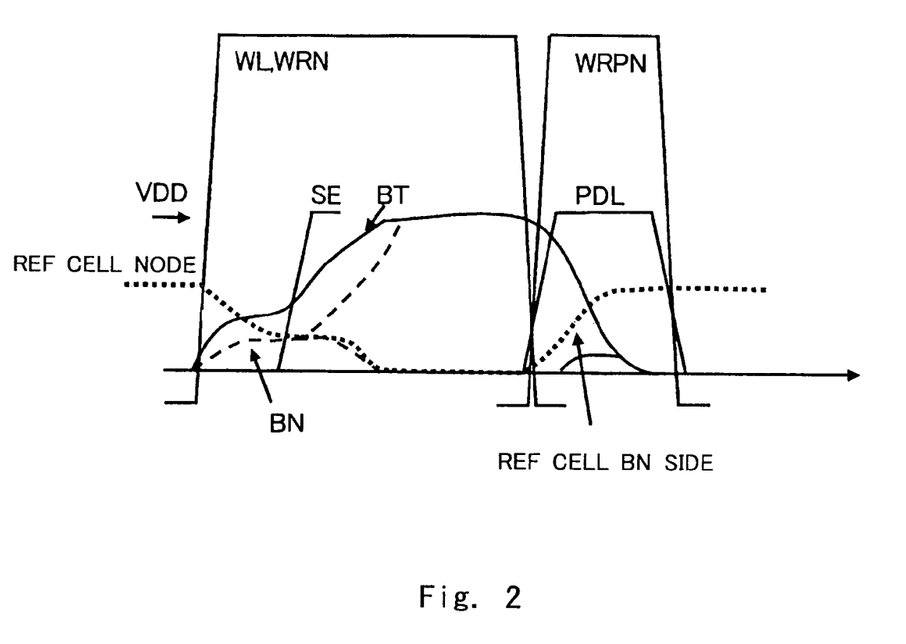
FIG. 2 is a timing chart showing an operation of the circuit according to the first embodiment.

Hereinafter, the present embodiment will be described taking the main cell connected to the bit line BT as an example. FIG. 2 is a timing chart showing an operation of a circuit according to the present embodiment. Hereinafter, the operation of the memory circuit of the present embodiment will be described with reference to FIG. 2. Note that solid lines indicate the potential of the bit line BT and dashed lines indicate the potential of the bit line BN. The dotted lines indicate the potential of the capacitor of the Ref cell, which is the potential of the reference cell node. When the main cell stores the "H" level, the bit line BT is in the higher-side potential. When the main cell stores the "L" level, the bit line BN is in the higher-side potential. Both cases are shown in one drawing.

In a state in which the potential is precharged to the ground potential, in order to read out the data held in the main cell $CELL_T$, the word line WL connected to the main cell $CELL_T$ and the word line WRN connected to the Ref cell connecting transistor are raised to the voltage VPP which is higher than the power supply voltage VDD. In this case, the voltage of the word line WL connected to the main cell $CELL_T$ and the voltage of the word line WRN connected to the Ref cell need to be increased to the voltage VPP in order to input and output the voltage in the power supply voltage VDD level.

Then the sense enable signal SE is raised to operate the sense amplifier SA. The sense amplifier SA amplifies the potential difference of the bit lines BT and BN and determines the data held in the main cell $CELL_T$.

Then the word lines WL and WRN connected to the main cell $CELL_T$ are fallen, and the precharge signal line PDL and the word line WRPN are raised. Since the precharge signal PDL is raised, the transistors TR1, TR2, and TR3 in the precharge circuit PRE are in the ON state and the bit lines BT and BN are precharged to the ground potential. As is often the case, the Ref cell may become the "H" level when the main cell stores the "L" level. Therefore, the word line WRPN is raised to the voltage VPP which is higher than the power supply voltage VDD.

In the present embodiment, in the precharge operation, the switch SW becomes a conduction state in order to connect one end of the Ref voltage supply transistor $TR_{VRef}$ and the bias voltage generating circuit HVDD. In the precharge operation, charge current for the Ref capacitor $C_{Ref}$ or discharge current from the Ref capacitor $C_{Ref}$ flows. In the present embodiment, when one end of the Ref voltage supply transistor $TR_{VRef}$ and the bias voltage generating circuit HVDD are short-circuited., then the charge current and the discharge current of the capacitor $C_{Ref}$ of the Ref cell appear in the counter electrode of the cell as the negative-phase current. The negative-phase current is transferred to the reference cell node through the switch SW and the transistor $TR_{VRef}$. By providing the switch SW in the area close to the Ref cell and short-circuiting the both ends of the capacitor $C_{Ref}$ in the precharge operation, the current of the counter electrode can be employed as a part of the charge current and the discharge current to the electrode connected to the reference voltage source Vref of the Ref cell. As a result, the peak current from the reference voltage source Vref can be reduced.

Although the switch SW short-circuits the node between the reference voltage source Vref and the Ref voltage supply transistor $TR_{VRef}$ and the HVDD in FIG. 1, it is also possible that the switch short-circuits the node between the Ref cell $C_{Ref}$ and the Ref voltage supply transistor $TR_{VRef}$ and the HVDD because it is the sufficient condition that the negative-phase current of the charge current and the discharge current of the Ref cell can be generated in the counter electrode. In order to improve the effect on the negative-phase current of the counter electrode, the switch SW is preferably disposed in a position sufficiently close to the Ref cell. It is preferable that the wiring resistance between the node connected to the switch and the Ref cell is sufficiently lower than the wiring resistance between the node connected to the switch and the reference voltage source Vref. Since both of the bias voltage generating circuit HVDD and the reference voltage source Vref output same 1/2 VDD, they may be collectively formed as one power supply circuit. Now the switch SW is employed to short-circuit both ends of the capacitor of the Ref cell in the precharge operation in the embodiment. But if the counter electrode of the capacitor of the Ref cell were connected to the node between the reference voltage source Vref and the Ref voltage supply transistor $TR_{VRef}$, the both ends of the capacitor are not short-circuited unless the transistor $TR_{VRef}$ is in the ON state in the precharge state. Therefore, even when the switch SW is not provided, the effect produced by short-circuiting the negative-phase current generated at the counter electrode can be expected. However, when the bias voltage generating circuit HVDD and the reference voltage source Vref are separately provided as shown in FIG. 1, the switch SW is preferably provided since each voltage from two power supply circuits is connected in one place.

Second Embodiment

Figure 3:
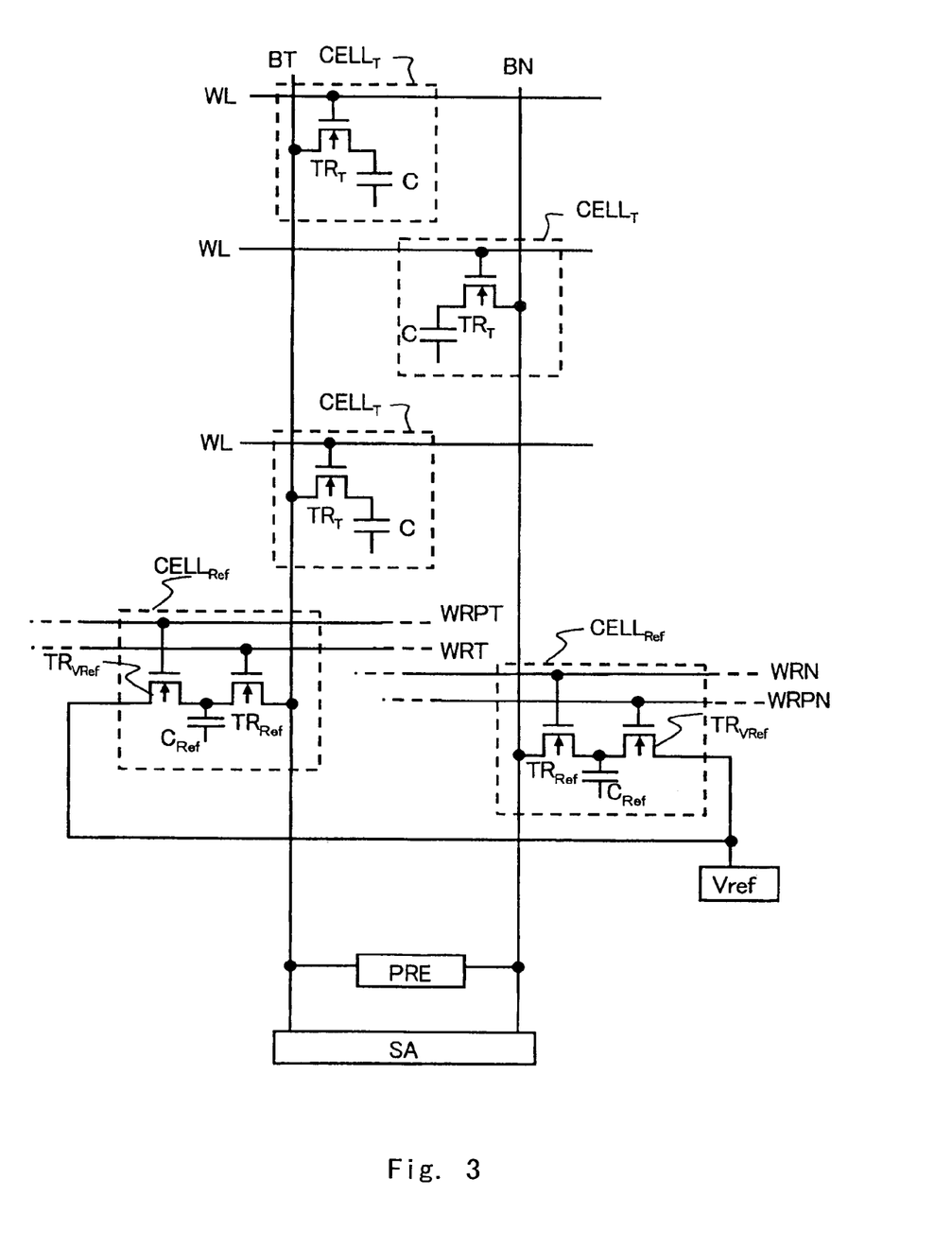
FIG. 3 is a circuit diagram showing a semiconductor storage circuit according to a second embodiment.
Figure 4:
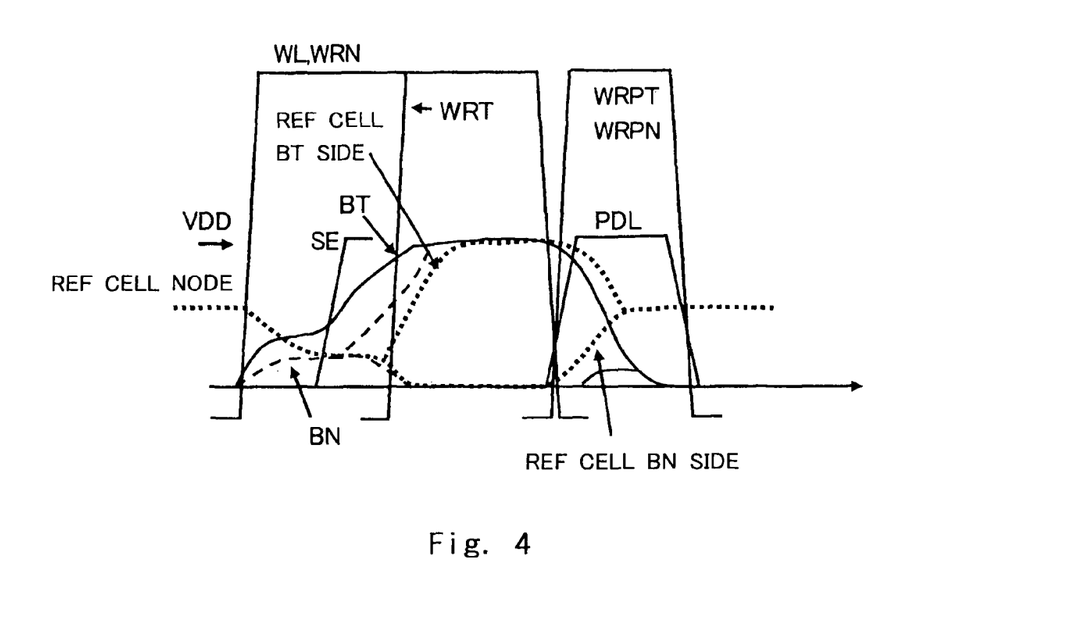
FIG. 4 is a timing chart showing a circuit operation according to the second embodiment.

Hereinafter, the second embodiment of the present invention will be described with reference to the drawings. FIG. 3 is a circuit diagram showing a memory circuit of the second embodiment of the present invention. The precharge circuit PRE and the sense amplifier SA in FIG. 3 have the same configuration as those in FIG. 1. Therefore, the detailed circuit diagram thereof is omitted here. FIG. 4 is a timing chart showing the operation of the present embodiment.

In the first embodiment, the bias voltage generating circuit HVDD is connected to one end of the Ref cell, and both ends of the Ref cell are short-circuited in the precharge operation. In the first embodiment, when the data in the main cell connected to the bit line BT is read out or written, only the word lines WRN and WRPN of the Ref cell connected to the bit line BN are raised. On the other hand, in the present embodiment, even when the data in the main cell connected to the bit line BT side is read out and written, the word line WRT of the Ref cell connected to the bit line BT side is raised as is the same as WL and WRN (see FIG. 4). The word line WRT is raised after the sense enable signal SE operating the sense amplifier is raised to determine the data held in the bit lines BT and BN by the sense amplifier (see FIG. 4). Then the Ref voltage supply transistor (fourth transistor) in the main cell side is connected to the common reference voltage source Vref which is common to the Ref cells of the bit lines BT and BN. Since the bit lines BT and BN always have the opposite data of "H" and "L" with each other, if the main cell connected to the bit line BT holds "H" level, the "H" level is written in the Ref cell connected to the bit line BT and the "L" level is written in the Ref cell connected to the bit line BN.

In the precharge operation, the word lines WRPT and WRPN are raised at the same time. The Ref cell connected to the bit line BT and the Ref cell connected to the bit line BN hold the opposite data with each other. Therefore, by raising the WRPT and WRPN at the same time in the precharge operation, the Ref cell connected to the bit line BT and the Ref cell connected to the bit line BN execute the opposite operation of charge or discharge with each other as shown in FIG. 4. Since the Ref cell connected to the bit line BT and the Ref cell connected to the bit line BN perform the opposite operation of the charge operation or the discharge operation with each other, each charge is neutralized in the precharge operation, which makes it possible to reduce the load of the reference voltage source Vref and to reduce the peak current. When the main cell connected to the bit line BN is read out, both of the word lines of the REF cell connected to the bit lines BT and BN are raised for the operation, so that the peak current with the reduced reference voltage Vref can be reduced.

As described above, according to the present invention, the both ends of the capacitor of the Ref cell are short-circuited or the Ref cells connected to the bit line pair BT and BN are connected to operate the both Ref cells in the reading operation, so that it makes it possible to reduce the load applied to the reference voltage source Vref and to reduce the peak current having reduced reference voltage by employing the negative-phase current.

Third Embodiment

The semiconductor storage circuit according to the third embodiment includes both the configurations of the first embodiment and the second embodiment for generating the negative-phase current. Further, a control circuit selecting either one or both of the operations is provided in the semiconductor storage circuit.

Figure 5:
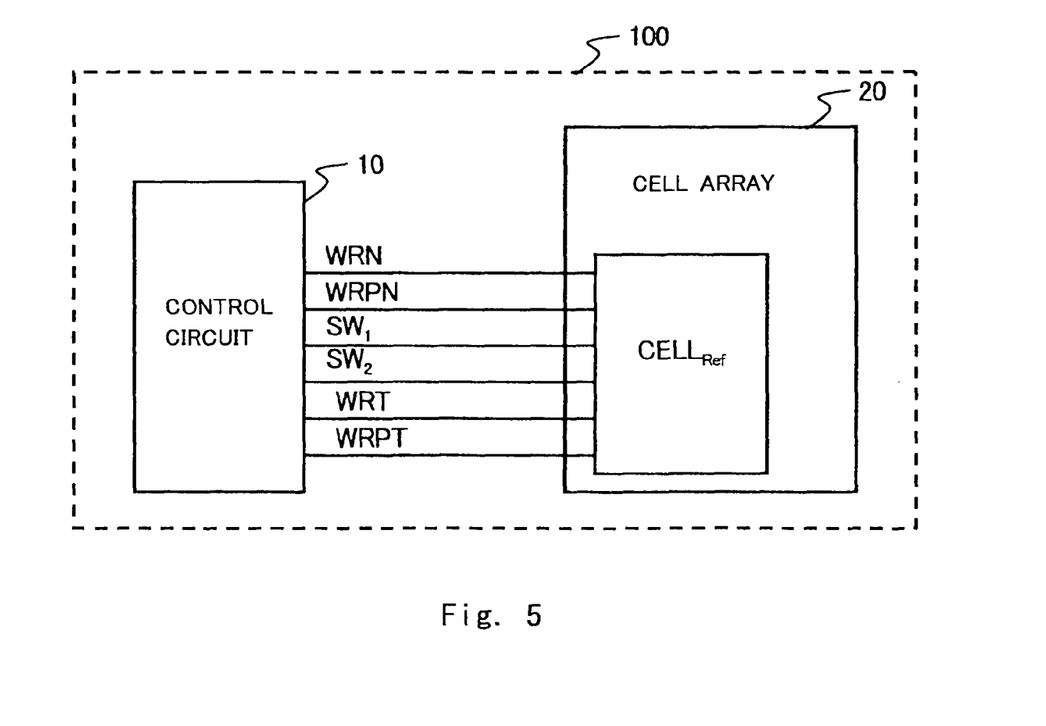
FIG. 5 is a block diagram showing a whole structure of a semiconductor storage circuit according to a third embodiment.

FIG. 5 shows a whole configuration of the semiconductor storage circuit according to the third embodiment. As shown in FIG. 5, the semiconductor storage circuit 100 includes a control circuit 10 and a cell array 20. The control circuit 10 is connected to the cell array 20 through wirings controlling ON and OFF of the word lines WRN, WRPN, WRT, WRPT, and the SW1 and SW2.

Figure 6:
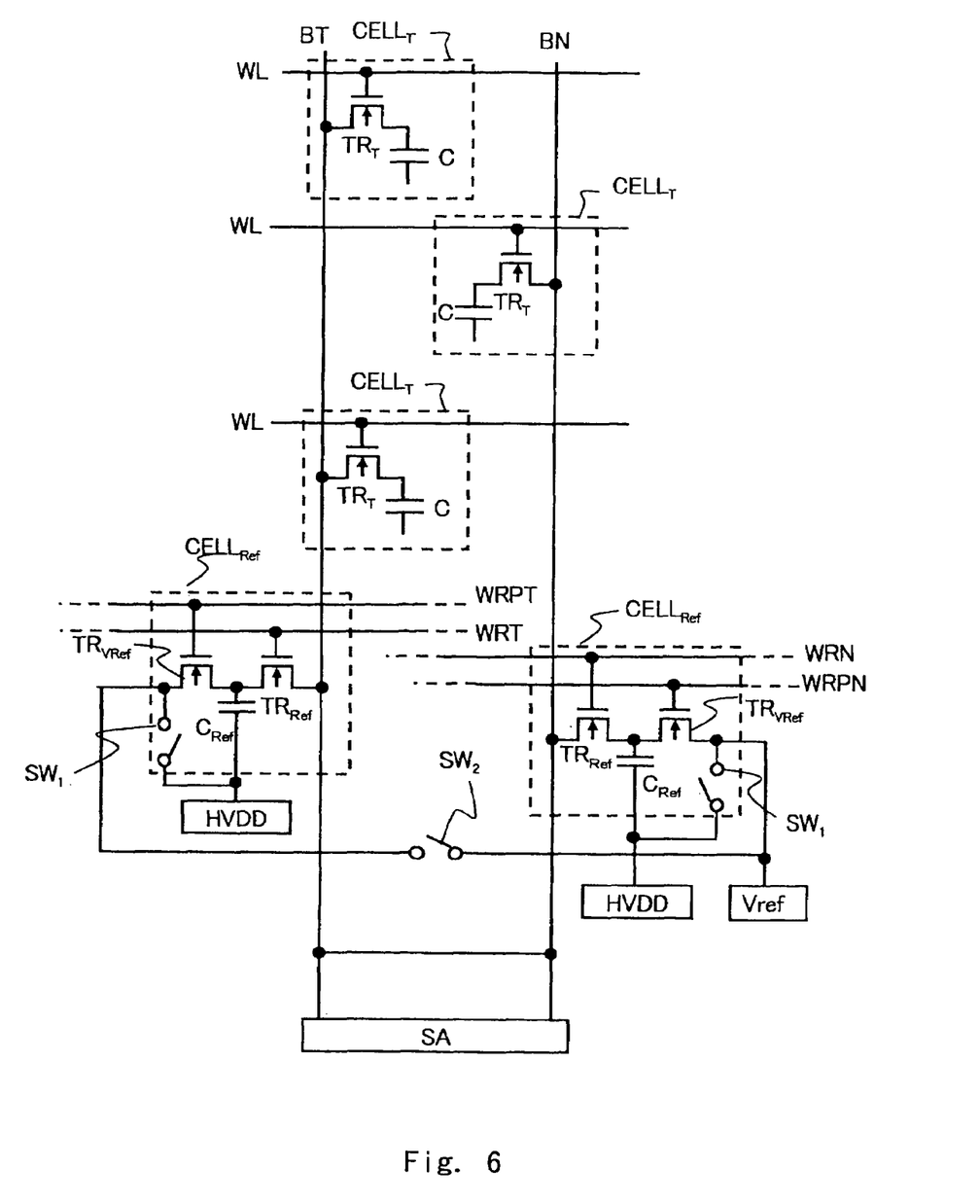
FIG. 6 is a circuit diagram showing a part of the semiconductor storage circuit according to the third embodiment.

FIG. 6 shows a specific configuration of the cell array 20. As shown in FIG. 6, this configuration includes both the configurations of the first embodiment and the second embodiment. In other words, the bias voltage generating circuit HVDD and the Ref voltage supply transistor $TR_{VRef}$ are connected through the switch SW1, and the Ref voltage supply transistor $TR_{VRef}$ in the main cell side (second transistor) and the Ref voltage supply transistor $TR_{VRef}$ in the main cell side (fourth transistor) are connected through the switch SW2.

The control circuit 10 selectively controls one or both of a state of turning on the SW1 to electrically connect the bias voltage generating circuit HVDD and the Ref voltage supply transistor $TR_{VRef}$, or the reference cell node and the bias node and a state of turning on the SW2 to electrically connect the second transistor and the fourth transistor when the Ref voltage supply transistor in the main cell side (second transistor) and the Ref voltage supply transistor in the main cell side (fourth transistor) are in the conduction state. Accordingly, it is possible to effectively reduce the load applied to the reference voltage source regarding the current flowing in the discharge operation in the reference cell node of the Ref cell, which makes it possible to prevent the circuit size from being increased.

It is apparent that the present invention is not limited to the above embodiments, but may be modified and changed without departing from the scope and spirit of the invention.

What is claimed is:

1. A semiconductor storage device precharging a bit line pair to a ground potential, the semiconductor storage device comprising:
   a sense amplifier connected between the bit line pair;
   a storage cell connected to one of the bit line pair and storing data;
   a first transistor controlling a conduction state between the other of the bit line pair and a reference cell node;
   a second transistor connected between a reference voltage source generating a reference voltage and the reference cell node, the second transistor being controlled from the first transistor; and
   a capacitor setting a potential of the reference cell node, wherein
   the semiconductor storage device aids charge and discharge of the capacitor when the second transistor is in the conduction state by using a negative-phase current of a current flowing between the reference cell node and the second transistor,
   the capacitor is connected between a bias node and the reference cell node and sets the potential of the reference cell node according to a stored charge amount, the bias node being supplied with a bias voltage generated by a bias voltage generating circuit, and
   the reference cell node and the bias node are electrically connected when the second transistor is in the conduction state so that the negative-phase current of the current flowing between the reference cell node and the second transistor is generated to aid the charge and the discharge of the capacitor.

2. The semiconductor storage device according to claim 1, wherein the reference voltage source and the bias voltage generating circuit are formed by one power supply circuit.

3. The semiconductor storage device according to claim 1, wherein a wiring resistance between the bias node and the reference cell node is lower than a wiring resistance between the reference cell node and the reference voltage source.

4. The semiconductor storage device according to claim 1, wherein a voltage generated by the bias voltage generating circuit is applied to the other end of the storage cell which is not connected to one of the bit line pair.

5. The semiconductor storage device according to claim 1, further comprising:
   a third transistor controlling a conduction state between one of the bit line pair and a second reference cell node;
   a fourth transistor connected between the second reference cell node and the second transistor, the fourth transistor being controlled from the third transistor; and
   a second capacitor connected to the second reference cell node and setting a potential of the second reference cell node according to the stored charge amount, wherein
   the second transistor and the fourth transistor are electrically connected so that the negative-phase current of the current flowing between the first reference cell node and the second transistor is generated to aid the charge and the discharge of the capacitor.

6. The semiconductor storage device according to claim 5, wherein the other end of the second transistor which is not connected to the first reference cell node and the other end of the fourth transistor which is not connected to the second reference cell node are commonly connected to the reference voltage source.

7. The semiconductor storage device according to claim 1, wherein the reference voltage source generates a voltage which is substantially half of a power supply voltage of the semiconductor storage device.

8. A semiconductor storage device precharging a bit line pair to a ground potential, the semiconductor storage device comprising:
   a sense amplifier connected between the bit line pair;
   a storage cell connected to one of the bit line pair and storing data;
   a first transistor controlling a conduction state between the other of the bit line pair and a first reference cell node;
   a second transistor connected to the first reference cell node and controlled from the first transistor;
   a first capacitor connected to the first reference cell node and setting a potential of the first reference cell node according to a stored charge amount;
   a third transistor controlling a conduction state between one of the bit line pair and a second reference cell node;
   a fourth transistor connected between the second reference cell node and the second transistor and controlled from the third transistor;
   a second capacitor connected to the second reference cell node and setting a potential of the second reference cell node according to a stored charge amount; and
   a control circuit selectively controlling a state of electrically connecting to at least one of the first reference cell node and the second reference cell node and a bias node and a state of electrically connecting the second transistor and the fourth transistor when the second transistor and the fourth transistor are in the conduction state.

* * * * *